US006639473B1

United States Patent
Kobayashi (10) Patent No.: US 6,639,473 B1
(45) Date of Patent: Oct. 28, 2003

(54) METHOD AND/OR APPARATUS FOR CONTROLLING A COMMON-BASE AMPLIFIER

(75) Inventor: Kevin W. Kobayashi, Torrance, CA (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 0 days.

(21) Appl. No.: 10/123,503

(22) Filed: Apr. 16, 2002

(51) Int. Cl.[7] ................................................ H03F 3/08
(52) U.S. Cl. .................... 330/308; 330/252; 250/214 A
(58) Field of Search ................................ 330/252, 308, 330/311, 279; 250/214 A; 327/359

(56) References Cited

U.S. PATENT DOCUMENTS

| 3,708,754 | A |   | 1/1973 | Diehl ........................ 330/1 A |
|---|---|---|---|---|
| 4,574,249 | A | * | 3/1986 | Williams ...................... 330/59 |
| 4,608,542 | A | * | 8/1986 | Siegel ........................ 330/279 |
| 5,304,949 | A | * | 4/1994 | Chun ......................... 330/296 |
| 6,069,534 | A |   | 5/2000 | Kobayashi .................. 330/308 |
| 6,285,259 | B1 |  | 9/2001 | Franck et al. ............... 330/301 |
| 6,287,701 | B1 |  | 9/2001 | Oochi et al. ................ 428/447 |

OTHER PUBLICATIONS

"Integrated High Frequency Low–Noise Current–Mode Optical Transimpedance Preamplifiers: Theory and Practice", By: Tongtod Vanisri and Chris Toumazou, IEEE Journal of Solid–State Circuits, vol. 30, No. 6, Jun. 1995, pp. 677–685.

"Wide–Band Integrated Optical Receiver with Improved Dynamic Range Using a Current Switch at the Input", By L.A.D. van den Broeke and A.J. Nieuwkerk, IEEE Journal of Solid–State Circuits, vol. 28, No. 7, Jul. 1993, pp. 862–864.

* cited by examiner

Primary Examiner—Henry Choe
(74) Attorney, Agent, or Firm—Christopher P. Maiorana, P.C.

(57) ABSTRACT

An apparatus comprising a common-base amplifier circuit and a control circuit. The amplifier circuit may be configured to generate an output signal having a transimpedance bandwidth in response to an input signal. The control circuit may be (i) coupled between the output signal and the input signal and (ii) configured to provide a DC offset adjustment by providing current steering at the input signal.

21 Claims, 10 Drawing Sheets

METHOD AND/OR APPARATUS FOR CONTROLLING A COMMON-BASE AMPLIFIER

FIELD OF THE INVENTION

The present invention relates to a method and/or apparatus for implementing optical receivers generally and, more particularly, to a method and/or apparatus for electronically tuning the transimpedance response of an optical receiver.

BACKGROUND OF THE INVENTION

Figure 1:
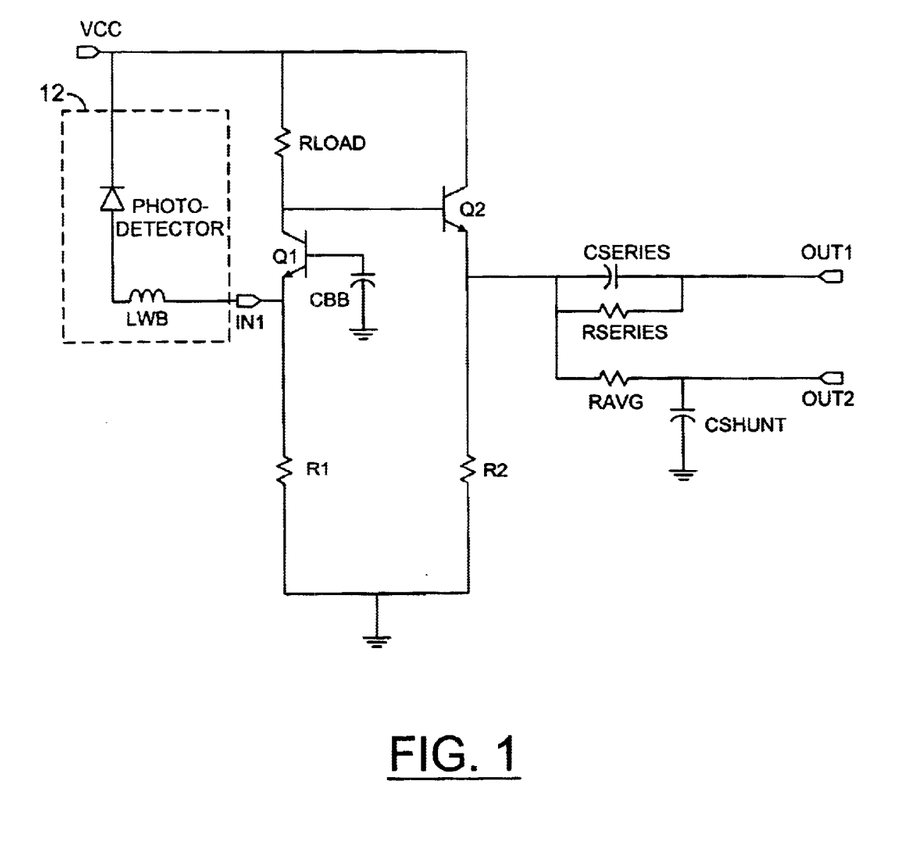
FIG. 1 illustrates a conventional a singled-ended common-base input stage followed by an RC power splitter.

Referring to FIG. 1, a circuit 10 implementing a conventional singled-ended common-base input stage followed by an RC power splitter is shown. The circuit 10 is shown receiving an input from a photo-detector 12. The circuit 10 provides a DC balanced output to be directly coupled to a successive differential output stage. The RF (or high speed signal path) goes through a series capacitor CSERIES.

A practical limit to wide band applications is imposed by the capacitor CSERIES, especially for 40 Gb/s SONET OC-768 applications. A large value of the capacitor CSERIES is used to obtain low frequency gain response. However, a small-low parasitic capacitor CSERIES is used to obtain a resonance free bandwidth up to 40 GHz. This competing requirement is typically not resolved without compromising either lower or higher frequency response. Such a limitation is fundamentally caused by the capacitor CSERIES in series with the high speed signal line. However, elimination of the capacitor CSERIES results in gain loss across the entire band due to the voltage division caused by the resistor RSERIES of the power splitter.

The common-base input allows high input overload capability. A monolithic RC power splitter is used to obtain DC balance fed to the differential output OUT1 and OUT2. The capacitor CSERIES is implemented in-line with the RF signal path. Such a monolithic implementation can cause parasitic self resonance problems in-band, especially for 40 Gb/s applications. A smaller value for the capacitor CSERIES can inhibit the onset of parasitic effects and can result in impairment of low frequency performance. The capacitor CSERIES can also cause group delay dispersion due to self-resonances within a 100 kHz–40 GHz band.

Figure 2:
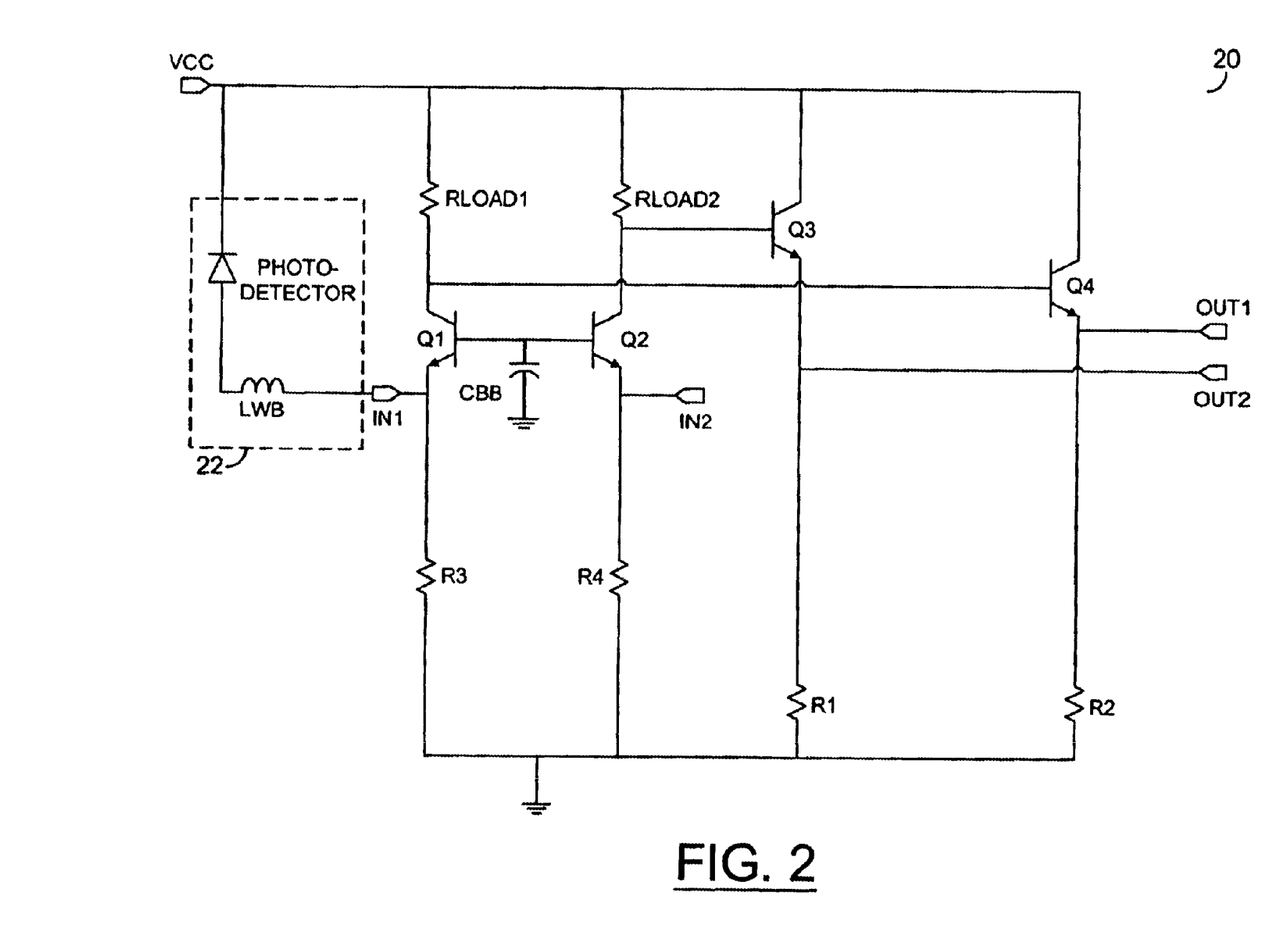
FIG. 2 illustrates a differential common-base input stage followed by an emitter follower stage.

Referring to FIG. 2, a circuit 20 illustrates a conventional differential common-base input stage followed by an emitter follower stage. The circuit 20 is shown receiving an input from a photo-detector 22. When driven single-endedly by the photo-detector 22, a DC offset imbalance occurs at the outputs of the follower stage. Such a DC offset imbalance can create duty-cycle distortion and inter-symbol interference (ISI) as well as common-mode bias problems for a successive differential output amplifier stage.

The common-base input of the circuit 20 allows high input overload capability. The differential common-base input enables differential DC balanced outputs OUT1 and OUT2 (under no power drive) which can be directly coupled to a differential output buffer stage. With increasing optical input power illuminating the photo-detector 22, the DC levels can become unbalanced leading to duty cycle distortion.

In order to satisfy the need for high current overload capability, the common-base transimpedance pre-amplifier topologies shown in FIG. 1 and FIG. 2 are commonly used. Common-base input stages are capable of high input currents, but offset distortion still arises when converting the signal from single-ended to complementary outputs. Offset distortion tends to increase as optical power is increased. Conventional approaches for achieving the single-end to complementary conversion for a common-base input stage use RC power splitters that may not be amenable to higher frequency monolithic implementations due to self resonances of the components. Differentially balanced CB topologies driven single-endedly do not generally address offset imbalance due to single-ended input operation.

Figure 3:
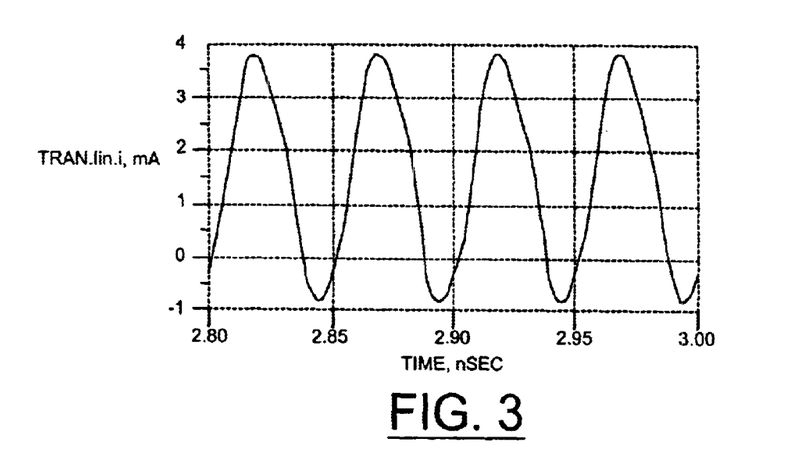
FIG. 3 illustrates an input photo current of >3 mA p—p.
Figure 4:
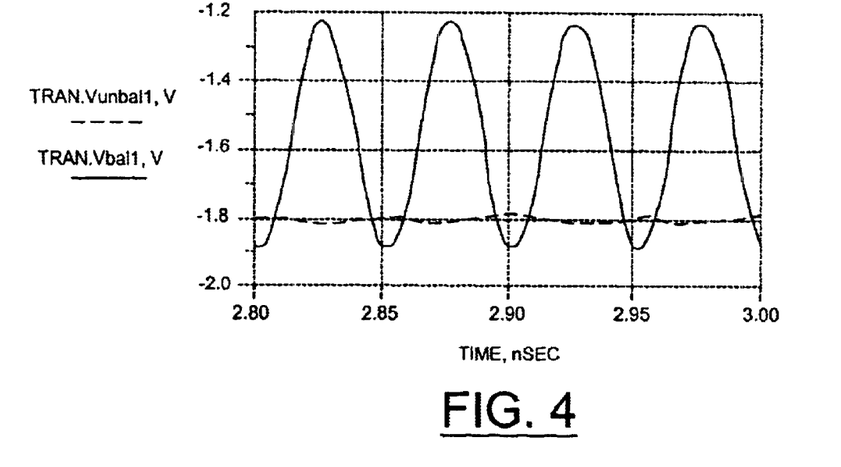
FIG. 4 illustrates a plot of the DC offset of the circuits of FIG. 2 under high photo-current drive level.
Figure 5:
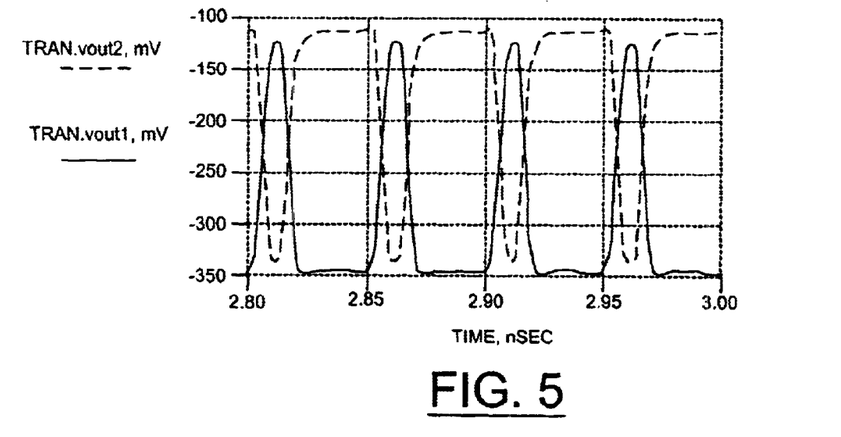
FIG. 5 illustrates a plot of the complementary outputs of the circuit of FIG. 2 illustrating severe duty cycle distortion (uneven consecutive bit periods)

Referring to FIG. 3, a diagram of an input waveform that may be presented to the circuit 10 or the circuit 20 is shown. The input waveform may be illustrated with 3 mA p—p overload current excitation when operating at 40 Gb/s. FIG. 4 illustrates a DC offset unbalance at the output of the common-base differential stage. FIG. 5 illustrates complementary outputs having severe duty cycle distortion.

It would be desirable to provide a transimpedance amplifier particularly suitable for high speed (e.g., 40 Gb/s) optical receiver applications that exhibits low duty cycle distortion under high overload conditions.

SUMMARY OF THE INVENTION

The present invention concerns an apparatus comprising a common-base amplifier circuit and a control circuit. The amplifier circuit may be configured to generate an output signal having a transimpedance bandwidth in response to an input signal. The control circuit may be (i) coupled between the output signal and the input signal and (ii) configured to provide a DC offset adjustment by providing current steering at the input signal.

The objects, features and advantages of the present invention include providing an amplifier that may (i) provide wide bandwidth transimpedance response that may be suitable for next generation (e.g., 40 Gb/s and greater) optical receiver applications, (ii) provide transimpedance bandwidth tuneability performance to accommodate for (a) process variations in the photo-detector, (b) process variations of the amplifier, and (c) module assembly manufacturing variations (wirebond variations, etc.), (iii) provide a circuit that may accommodate post assembly tuning of the transimpedance response, (iv) provide an amplifier with high dynamic range that may be suitable for 40 Gb/s optical receiver applications, (v) provide overload performance for state of the art 40 Gb/s diode responsivities of >0.9 A/W when overload current requirements of >2.85 mA p—p are needed, (vi) comply with an overload specification more aggressive than those imposed by common 10 Gb/s PIN diode technologies, and/or (vii) provide an approach for reducing waveform distortion in a transimpedance amplifier such as overshoot (ringing) and duty cycle distortion.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 6:
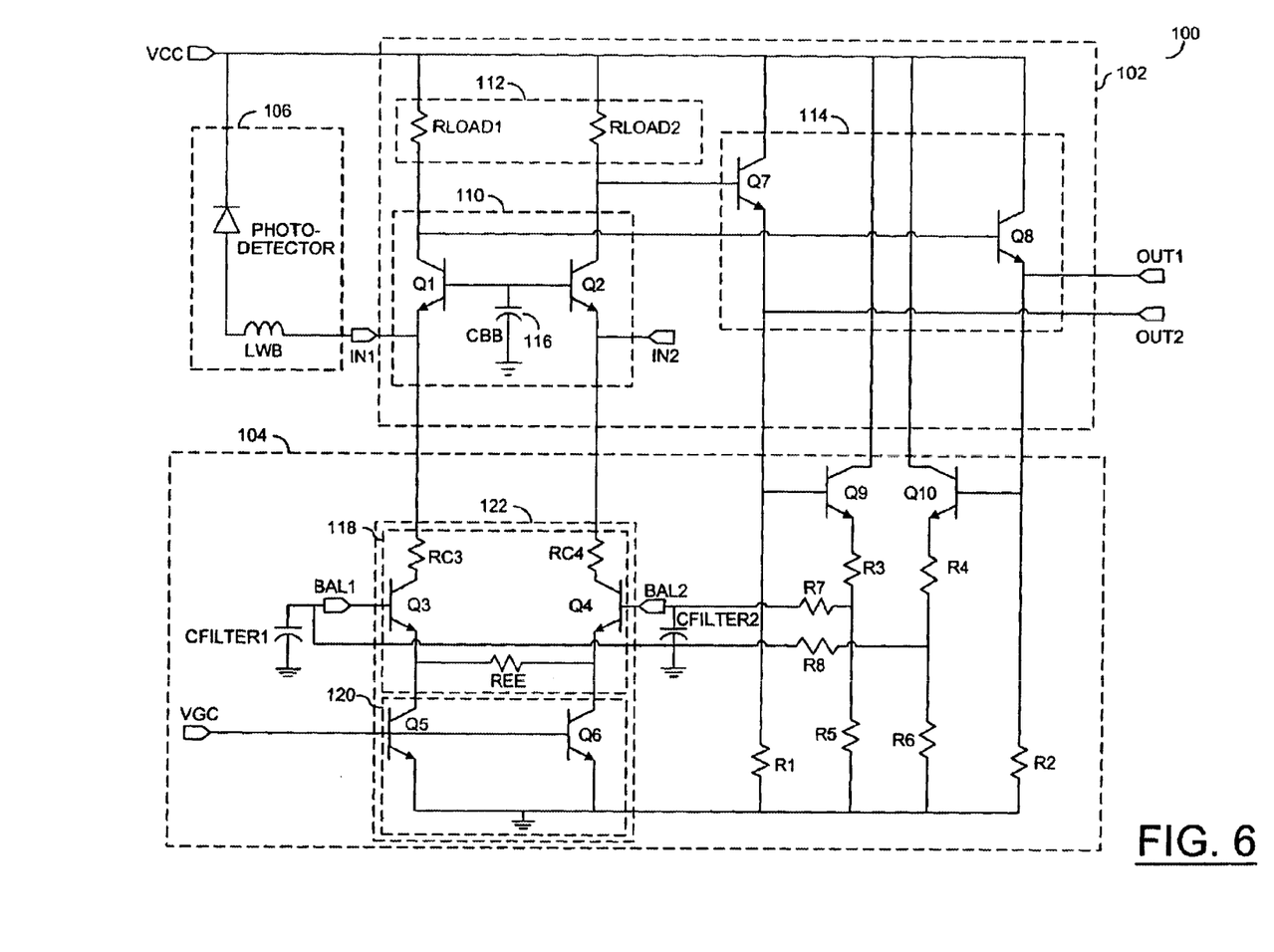
FIG. 6 illustrates a preferred embodiment of the present invention.

Referring to FIG. 6, a diagram of a circuit 100 is shown in accordance with a preferred embodiment of the present invention. The circuit 100 generally comprises an amplifier section (or circuit) 102, a control section (or circuit) 104, and an input section (or circuit) 106. The amplifier section 102 generally comprises a common-base (CB) input stage 110 with differential inputs, a load stage (or circuit) 112, and an output stage (or circuit) 114. The input stage 110 generally comprises a transistor Q1 and a transistor Q2. The load stage 112 generally comprises a resistor Rload1 and a resistor Rload2. The input stage 110 generally includes a bypass 116 that generally comprises an AC bypass capacitor (e.g., CBB). The output stage 114 may be implemented in an emitter follower configuration comprising a transistor Q7 and a transistor Q8.

The control circuit 104 may include a current source that may be implemented as a resistor R1 and a resistor R2. The current source generally provides level shifting and direct coupling to a successive differential output amplifier stage (to be described in more detail in connection with FIG. 7). In one example, the output stage 114 may be implemented as a differential limiter amplifier. However, other configurations may be implemented accordingly to meet the design criteria of a particular implementation. The input of such an amplifier may be driven differentially or single-endedly (as illustrated) to meet the design criteria of a particular implementation. When driven single-endedly, a DC imbalance or offset at the output of the follower stage may occur. Such an imbalance may become worse as input drive levels are increased, such as with an optically induced photo-current injected into the emitter of the transistor Q1 (e.g., at an input IN1). Without other components of the present invention (e.g., the circuit 104), such an imbalance or offset may lead to pre-mature duty-cycle distortion and poor inter-symbol interference (ISI). Even when the amplifier 102 is driven differentially, there may be a built in offset due to unequal complementary signal strengths or transistor and resistors process mismatches that may be amplified at the complementary outputs OUT1 and OUT2. With increasing operating frequencies, small process and manufacturing variations may lead to large variations at the outputs OUT1 and OUT2.

To compensate for a variety of variations, the circuit 100 of the present invention generally incorporates a DC offset adjustment loop (e.g., the control circuit 104). The control circuit 104 generally comprises an additional follower stage scaled in current and area so as not to load down the signal path, a resistor voltage divider, a low pass filter, and a differential current switch. The implementation of a current switch with a common-base input stage allows practical employment of the offset loop without impairing (e.g., loading down) the high speed performance of the CB-stage. The follower stage generally comprises a transistor Q9 and a transistor Q10 and can be scaled in area and size in order to minimize the loading of the high speed signal path. Moreover, they can be optimized for bandwidth peaking response. The resistor voltage divider generally comprises a resistor pair R3 and R5 and a resistor pair R4 and R6.

A low pass filter network generally comprises a resistor pair R7 and R8 and a capacitor pair CFILTER1 and CFILTER2. The differential current switch 118 generally comprises a transistor Q3, a transistor Q4, an emitter resistor REE, and isolation resistors RC3 and RC4. The offset adjustment loop generally corrects for the DC offset imbalance introduced by the single-ended to differential conversion of the topology as optical input power is increased. Additionally, an adjustable voltage controlled current source 120 may be implemented comprising a transistor Q5, a transistor Q6 and a voltage control input signal (e.g., VGC). The current source 120 may be implemented as a single transistor (e.g., if the resistor Ree is removed) or one or more transistors. The current switch 118 and the current source 120 may form a circuit 122.

The input signal VGC may control the adjustable voltage controlled current source 120 and may provide an adjustment for transimpedance gain-bandwidth (BW) response by changing the effective input impedance and gain of common-base transistors Q1 and Q2. Such a feature can be used to increase or decrease the active inductive nature of the input impedance of the circuit 100, allowing post assembly tuning of the response of the amplifier 116. Alternatively, the adjustment via the signal VGC may be configured to control the voltage gain of the common-base stage by changing the amount of current and, therefore, the voltage swing at the collectors of the transistors Q1 and Q2. Such control generally provides for the implementation of an automatic gain control (AGC) loop (e.g., the circuit 104) directly to the input stage in order to compensate for changing received input signal strengths. The AGC loop does not load down the input signal path, and thus bandwidth is not noticeably degraded or compromised.

A feedback loop for offset and duty cycle distortion correction may be incorporated by a second emitter follower stage (e.g., the transistors Q9 and Q10, the resistors R3 and R4 and the resistors R5 and R6), a low pass filter (e.g., the resistors R7 and R8 and the filter capacitor Cfilter1 and the filter capacitor Cfilter2), and a steering current switch 118 (e.g., the transistors Q3 and Q4, the resistors RC3 and RC4, the resistor Ree and the inputs Bal1 and Bal2) coupled to the emitters of the differential common-base input stage 110. The resistors RC3 and RC4 buffer the inputs from being loaded down by resonances caused by the collectors of the current switch. The resistor Ree can be adjusted to provide loop stability as well as damping of spurious transients. The transistors Q5 and Q6 may provide a current source that may bias the differential common-base stage 110 through the current switch 118. Signals fed to the bases of the current switch 118 will steer current through the common-base transistors Q1 and Q2 and their corresponding load resistors Rload1 and Rload2 to appropriately reduce offsets detected at the output. The strength of the current may be adjusted through the control signal VGC.

Since the voltage controlled current source (VCCS) controls the bias of the common-base transistors Q1 and Q2, the VCCS can effectively be implemented to tune the input impedance (Zin), and therefore, transimpedance response of the transimpedance amplifier circuit 100 (e.g., Tz=Zin*Av). Since the input impedance of the common-base transistors Q1 and Q2 is generally presented as a series inductance, the input impedance may be adjusted to tailor the amount of peaking inductance required to match to the generally capacitive impedance of the photo-detector of the circuit 106. Additionally, since the VCCS controls the amount of current through the load resistors Rload1 and Rload2, the signal VGC can also be implemented to control the voltage gain (Av) of the amplifier 102.

The circuit 100 will typically be directly cascaded to several (e.g., one or more) differential output stages (to be described in more detail in connection with FIG. 7.) The photo-diode 106 will be coupled to one input port (e.g., IN1), while the other port (e.g., IN2) may be un-connected. The external capacitors Cfilt1 and Cfilt2 may be provided to eliminate (or greatly reduce) high frequency introduced into the input via the current source and ensure low frequency signal integrity. The photo-detector 106 typically presents an impedance of a small capacitor in series with a contact resistor. For an example with 40 Gb/s performance, the diode capacitor may be implemented in the range of 25–100 fF with an associated contact resistance in the range of 10–40Ω.

An inductor (e.g., Lwb) may represent a finite parasitic inductance which exists between the photo-detector 106 and the input IN1 of the amplifier 102. The inductance Lwb generally does not have a predetermined value and can vary from module to module. Since the inductance Lwb can be construed as part of the input impedance of the circuit 102, the transimpedance-BW response may be directly affected by the value of the inductance Lwb.

The emitter input of a common-base transistor generally resembles an active inductor whose value is bias dependent. By providing the tuning via the signal VGC, the total series input inductance of the circuit 102 (which includes Lwb) may be fine tuned. Such tuning may be used to optimize the transimpedance-BW response after the optical sub-assembly has been manufactured. Such tuning may lead to the elimination of conventional mechanical hybrid tuning and the associated assembly/labor costs.

Figure 7:
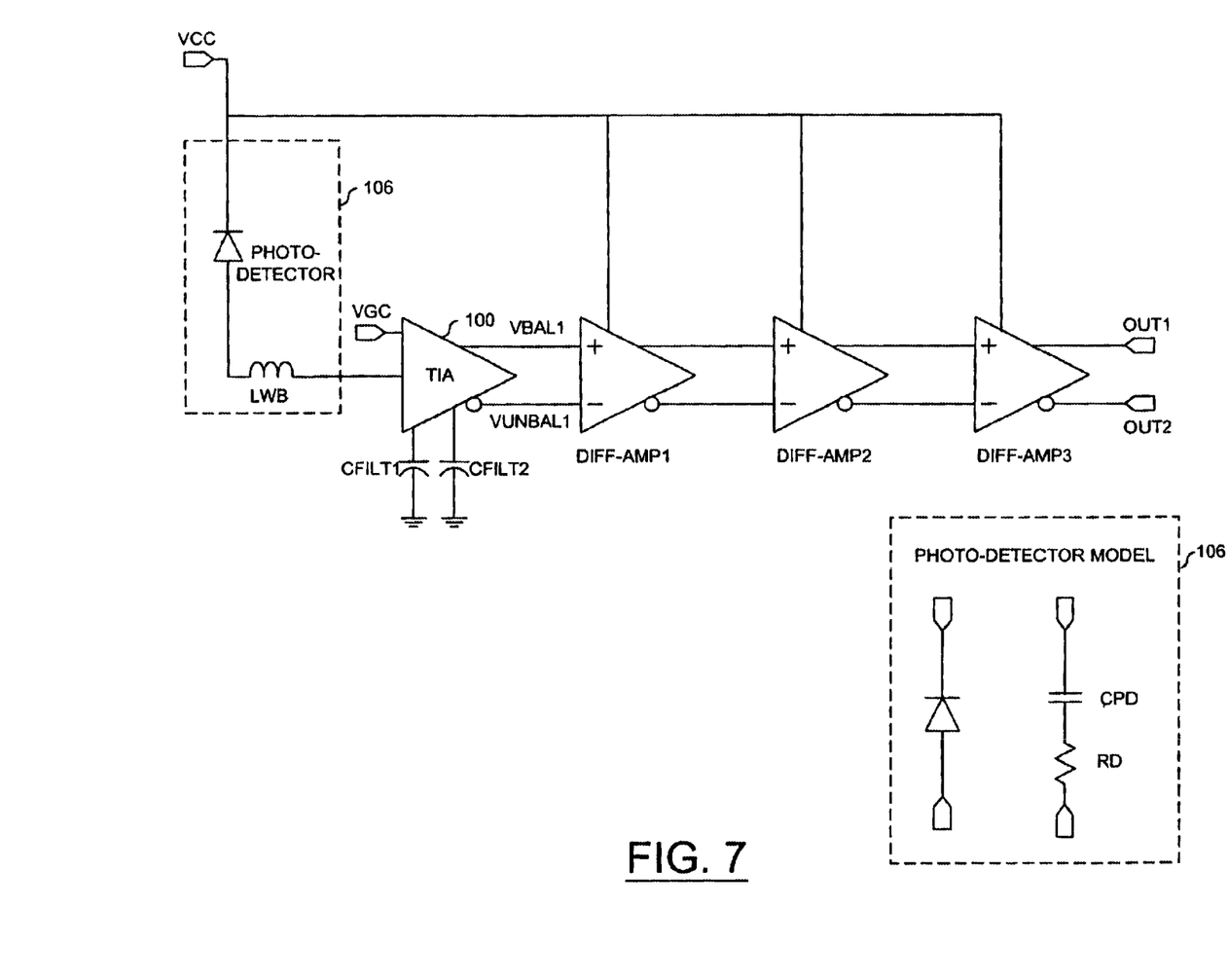
FIG. 7 illustrates a context of the present invention.

Referring to FIG. 7, an illustration of an implementation of the present invention is shown. The photo-detector 106 may be modeled as a simple series R-C network. The inductance Lwb generally represents the inductance of a ribbon, wirebond or flip chip trace which provides the RF medium between the photo-detector die and the input of the transimpedance die. A nominal value (e.g., between 0.2 and 0.25 nH) may be used when designing the transimpedance amplifier of the present invention. However, other values may be implemented to meet the design criteria of a particular implementation. The signal VGC generally provides post assembly tuning of the impedance matched interface of the circuit 100.

Figure 8:
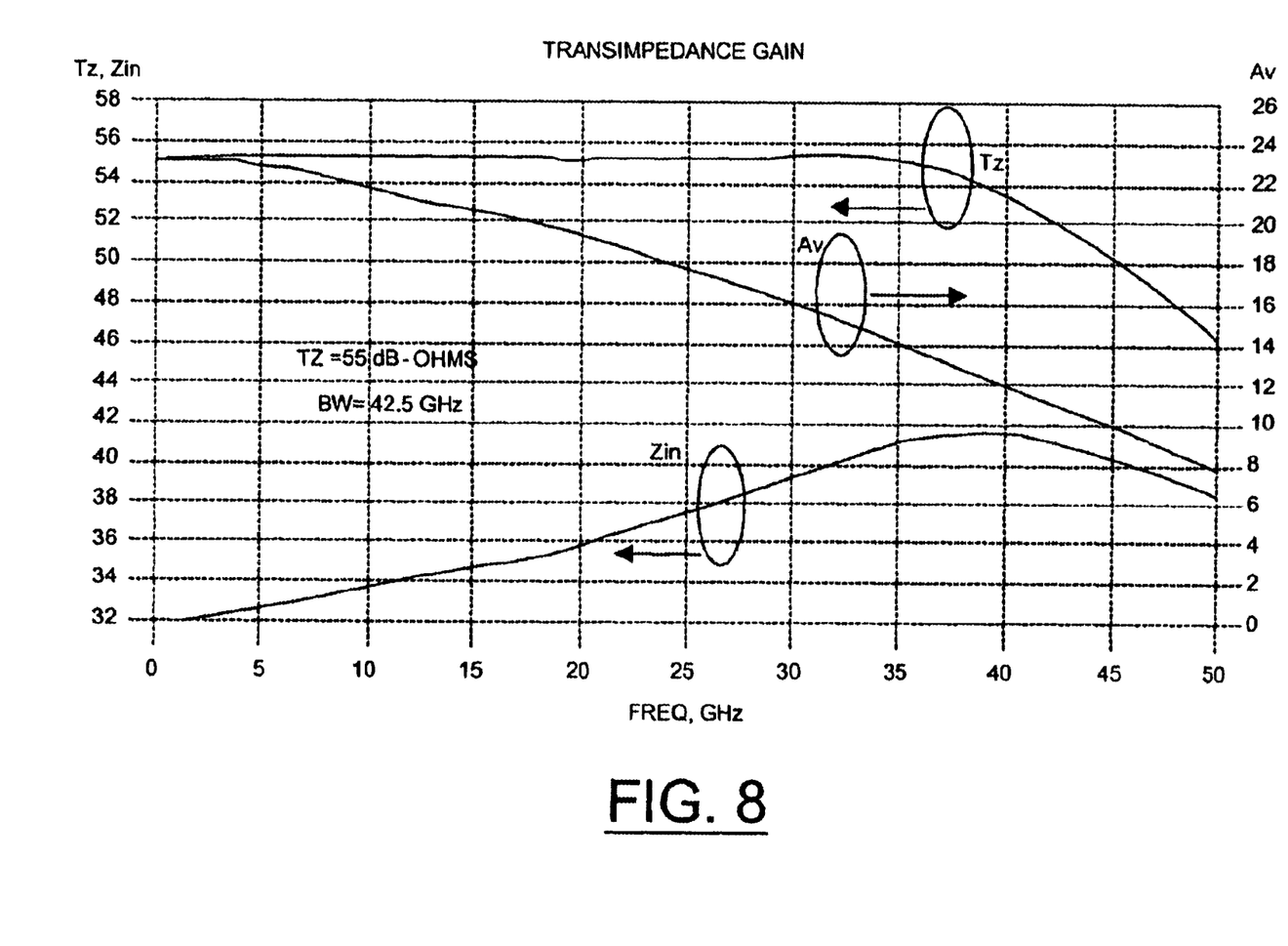
FIG. 8 illustrates a diagram of the transimpedance gain of the circuit of FIG. 6 illustrating pictorially that the transimpedance ($T_z$) is the addition of $Z_{IN}$(dBΩ) and $S_{ZI}$(dB) in decibels.

Referring to FIG. 8, a graph illustrating the input impedance, transimpedance gain and voltage gain of the present invention is shown. The transimpedance gain is generally equal to the sum of $S_{Z1}$(dB) and input impedance $Z_{IN}$(dB-Ω). The parasitic assumptions are Cd=40 fF, Rs=15 ohms and Lwb=0.2 nH. The graph illustrates $T_z$ (transimpedance is generally the product of $T_z$ (transimpedance)=$Z_{IN}$ (input impedance)·Av (voltage gain). The plot is dB to pictorially illustrate $T_z$(dBΩ)=$Z_{IN}$(dBΩ)+ $S_{21}$(dB) (e.g., Av) and $T_z$ can be tuned by changing slope of $Z_{IN}$ or $S_{21}$.

Figure 9:
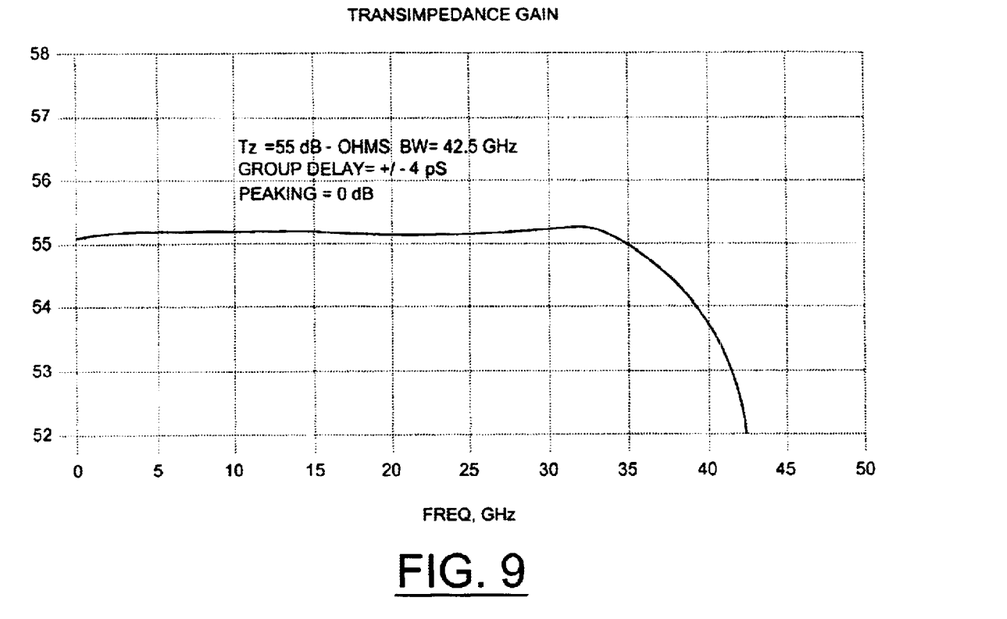
FIG. 9 illustrates a plot of the transimpedance gain of the present invention.
Figure 10:
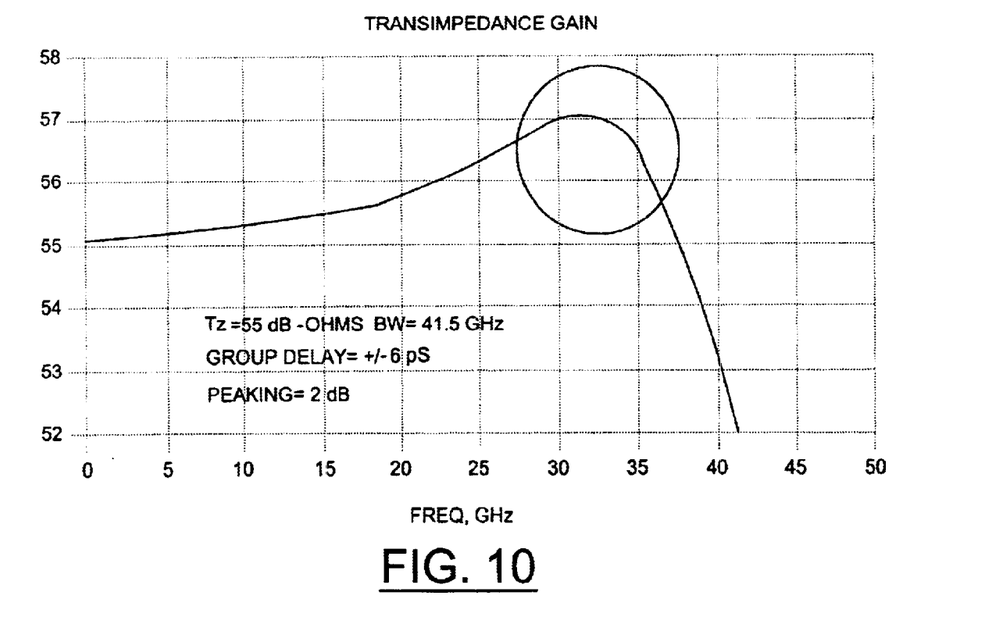
FIG. 10 illustrates another plot of the transimpedance gain of the present invention with post assembly parasitics.

Referring to FIG. 9, a plot of the transimpedance gain of the present invention is shown. The transimpedance gain illustrated in FIG. 9 may correspond to a 0 dB peaking when the parasitics are Cd=40 fF, Rs=15 ohms and Lwb=0.2 nH. Referring to FIG. 10, another plot of the transimpedance gain of the present invention is shown. The transimpedance gain waveform illustrated in FIG. 10 may correspond to a 2 dB peaking when the effects of post assembly parasitics are included (e.g., Cd=40 fF, Rs=15 ohms and Lwb=0.3 nH).

Figure 11:
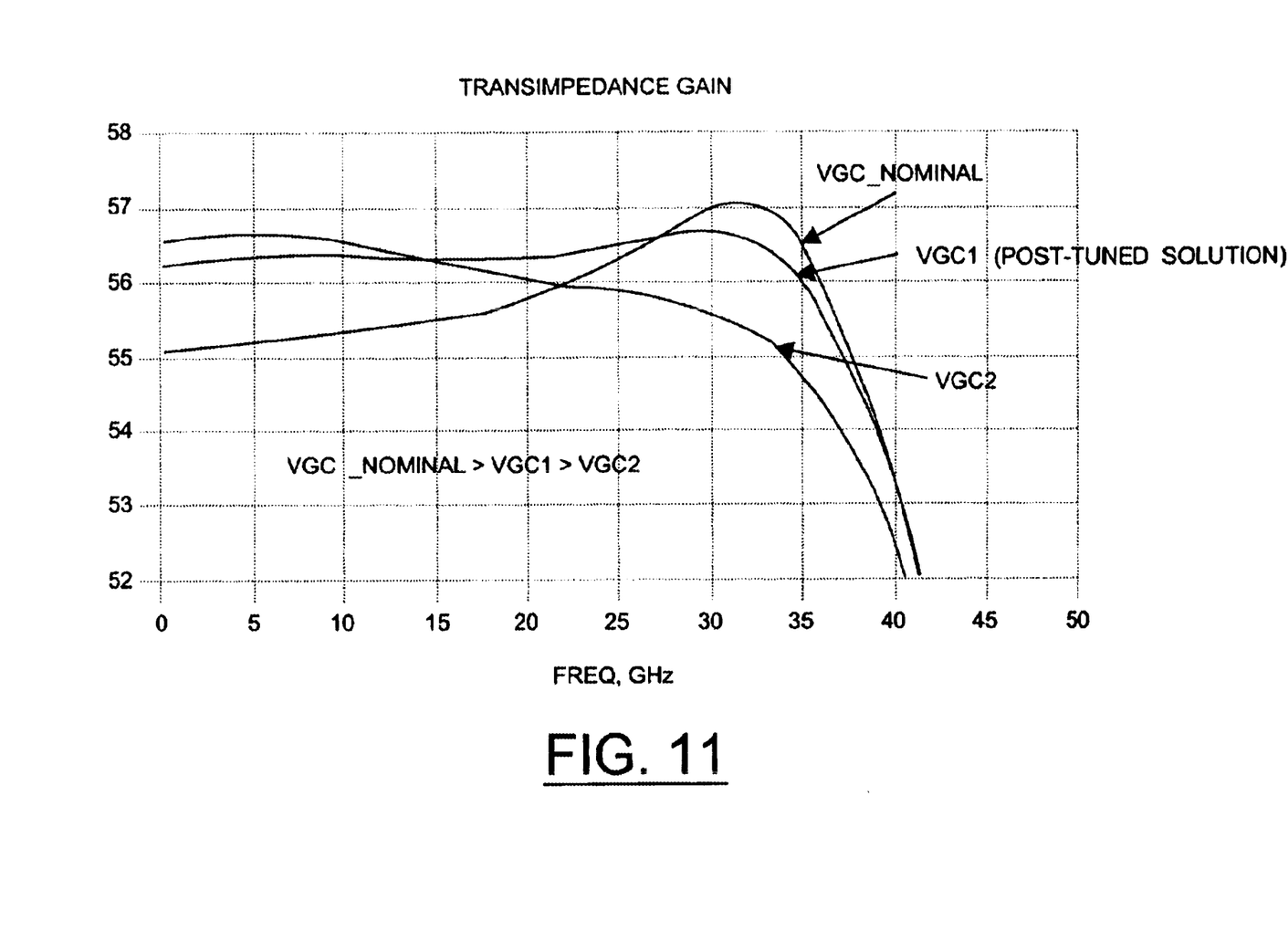
FIG. 11 illustrates another plot of the transimpedance gain of the present invention with transimpedance control to compensate for inductance assembly parasitics.

Referring to FIG. 11, another plot of the transimpedance gain of the present invention is shown. FIG. 11 may illustrate transimpedance control to compensate for Lwb assembly parasitics via the signal VGC. The waveforms of FIG. 11 may illustrate the transimpedance gain that corresponds to post assembly parasitics of Cd=40 fF, Rs=15 ohms and Lwb=0.3 nH for three example levels of the signal VGC. When the signal VGC is at a nominal level (e.g., VGC_NOMINAL), transimpedance gain may have a 2 dB peaking similar to the gain illustrated in FIG. 10. When the circuit 100 is tuned to a post-tuned (e.g., post-assembly) solution via adjustment of the signal VGC (e.g., a level VGC1), the transimpedance gain may have substantially 0 dB peaking. In another example, the signal VGC may be adjusted (e.g., to a level VGC2) that may provide greater than 1 dB peaking at relatively low frequencies (e.g., less than 20 Ghz). However, any appropriate tuning of the circuit 100 may be implemented via the signal VGC accordingly to meet the design criteria of a particular application.

Figure 12:
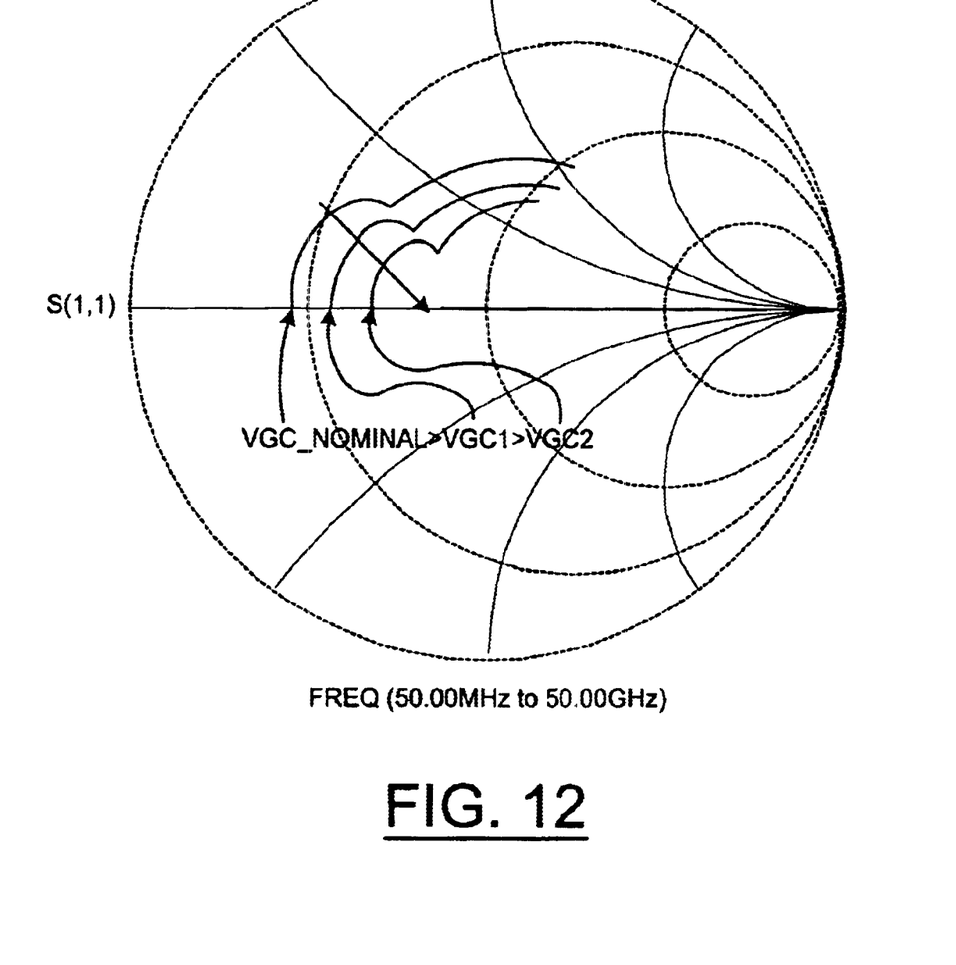
FIG. 12 illustrates a smith chart plot of the input impedance of the present invention as a function of tuning voltage.

Referring to FIG. 12, a plot of the input impedance as a function of the tuning voltage Vgc of the present invention is shown. The waveforms of FIG. 12 may illustrate a polar plot of the input impedance of the circuit 100 at a frequency range of 50 MHz to 50 Ghz. The waveforms illustrated in FIG. 12 may correspond to adjustment of the signal VGC to the levels VGC_NOMINAL, VGC1 and VGC2, respectively. As shown in FIGS. 11 and 12, tuning the signal VGC to lower levels may reduce the effective inductive impedance of the circuit 100 (e.g., Zin) and may provide compensation for the inductance Lwb assembly variation.

Figure 13:
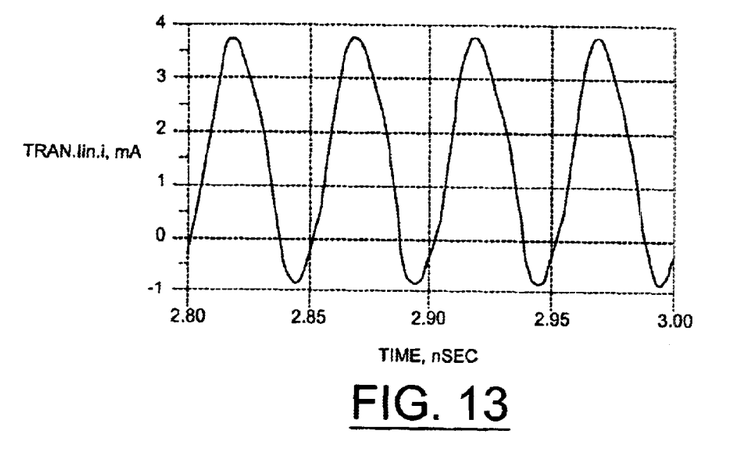
FIG. 13 illustrates input plots current waveform of >3 mA p—p.
Figure 14:
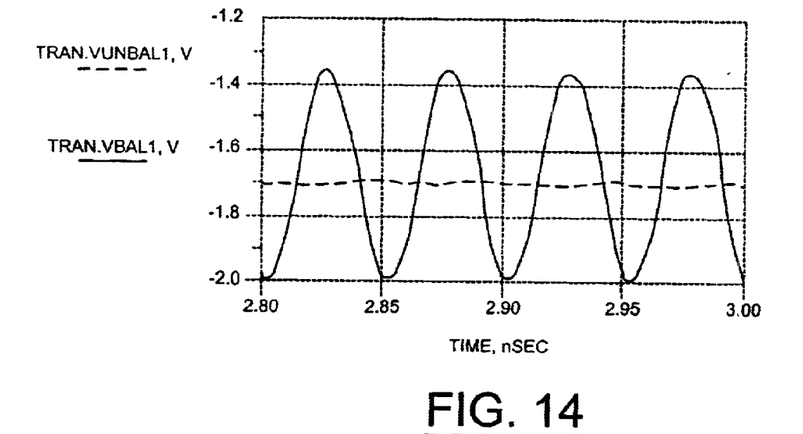
FIG. 14 illustrates DC balanced outputs due to employment of offset loop with current steer.
Figure 15:
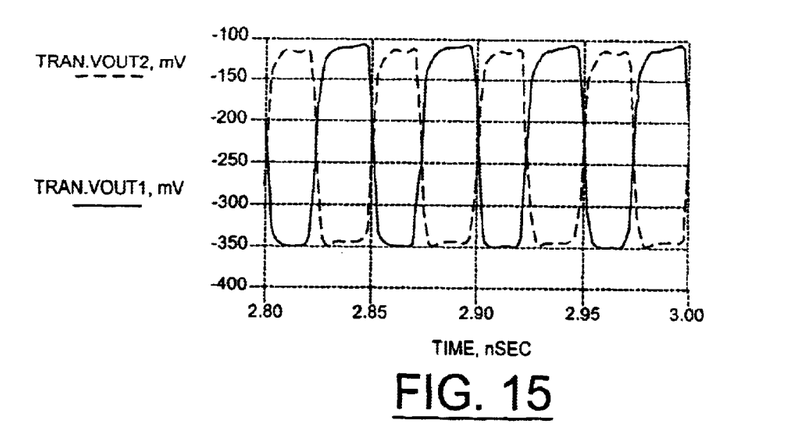
FIG. 15 illustrates overload performance of limited outputs showing improved duty cycle.

Referring to FIGS. 13–15, overload performance waveforms of the present invention are shown. FIG. 13 may illustrate an input photo-current waveform of >3 mA p—p that may be presented to the circuit 100. The input waveform may illustrate a 3 mA p—p overload input current at a frequency of 40 Gb/s similar to the input current shown in FIG. 3.

The waveforms of FIG. 14 may illustrate DC balance offset of the output of the circuit 100 (e.g., OUT1 and OUT2) when the input current shown in FIG. 13 is presented to the input IN1. When compared to the DC offset of conventional circuits as shown in FIG. 4, the circuit 100 may have substantially no DC offset. FIG. 15 may illustrate reduced duty cycle distortion waveforms of the output signals OUT1 and OUT2 of the circuit 100. When compared to the duty cycle of conventional circuits as shown in FIG. 5, the circuit 100 may have substantially reduced duty cycle distortion.

The transistors described and illustrated may be implemented as heterojunction bipolar transistors. However, other transistor technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a differential common-base amplifier circuit configured to generate an output signal having a transimpedance bandwidth in response to a differential input signal; and
   a control circuit (i) coupled between said output signal and said differential input signal and (ii) configured to provide a DC offset adjustment by providing current steering to said differential input signal, wherein said control circuit comprises (i) a first transistor pair configured to provide said DC offset adjustment and (ii) one or more second transistors configured to tune said transimpedance bandwidth.

2. The apparatus according to claim 1, wherein said control circuit is further configured to tune said transimpedance bandwidth.

3. The apparatus according to claim 1, wherein said output signal comprises a differential output signal.

4. The apparatus according to claim 1, wherein said first transistor pair is configured to receive a control signal.

5. The apparatus according to claim 4, wherein said control signal comprises an offset control signal.

6. The apparatus according to claim 5, wherein said offset control signal is configured to control a magnitude of said DC offset provided by said control circuit.

7. The apparatus according to claim 1, wherein one of said second transistors is configured to receive a control signal.

8. The apparatus according to claim 1, wherein said control circuit comprises a follower stage configured to receive said output signal.

9. The apparatus according to claim 2, wherein said differential input signal comprises a connected signal and an unconnected signal.

10. The apparatus according to claim 1, wherein said control circuit comprises a resistor voltage divider.

11. The apparatus according to claim 1, wherein said control circuit comprises a low pass filter.

12. The apparatus according to claim 1, wherein said control circuit comprises a differential current switch.

13. The apparatus according to claim 12, wherein said differential current switch comprises a plurality of transistors and a plurality of resistors.

14. The apparatus according to claim 9, wherein said connected signal comprises a photo-detector signal.

15. The apparatus according to claim 1, wherein a control signal coupled to said one or more second transistors is configured to adjust an input impedance of said amplifier circuit.

16. An apparatus comprising:
   means for generating an output signal in response to a differential input signal using a differential common-base amplifier, wherein said output signal has a transimpedance bandwidth; and
   means for providing a DC offset adjustment by providing current steering at said input signal, wherein said means for providing said DC offset adjustment comprises (i) a first transistor pair configured to provide said DC offset adjustment and (ii) one or more second transistors configured to tune said transimpedance bandwidth.

17. A method comprising the steps of:
   (A) generating an output signal having a transimpedance bandwidth in response to a differential input signal; and
   (B) implementing current steering at said differential input signal by providing a DC offset adjustment, wherein (i) said input signal comprises a photo-detector signal and said output signal comprises a differential signal (ii) said method tunes a differential common-base amplifier.

18. The method according to claim 17, wherein step (B) further comprises controlling a magnitude of said DC offset in response to a control signal.

19. The method according to claim 17, wherein step (A) further comprises generating said output signal via a follower stage.

20. The method according to claim 17, further comprising the step of:
   (C) adjusting an input impedance of said amplifier.

21. The method according to claim 17, further comprising the step of;
   tuning a transimpedance bandwidth using one or more transistors.

* * * * *